(12) United States Patent
Mangalore et al.

(10) Patent No.: US 10,832,931 B2
(45) Date of Patent: Nov. 10, 2020

(54) ELECTROSTATIC CHUCK WITH EMBOSSED TOP PLATE AND COOLING CHANNELS

(71) Applicant: APPLIED MATERIALS, INC., Santa Clara, CA (US)

(72) Inventors: Chethan Mangalore, Bangalore (IN); Arumuga Balan, Bangalore (IN); Jeonghoon Oh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 587 days.

(21) Appl. No.: 14/696,747

(22) Filed: Apr. 27, 2015

(65) Prior Publication Data

US 2015/0348813 A1    Dec. 3, 2015

Related U.S. Application Data

(60) Provisional application No. 62/005,002, filed on May 30, 2014.

(51) Int. Cl.
*H01L 21/683* (2006.01)
*H01L 21/67* (2006.01)
(Continued)

(52) U.S. Cl.
CPC .... *H01L 21/6833* (2013.01); *H01L 21/67109* (2013.01); *H01L 21/6875* (2013.01);
(Continued)

(58) Field of Classification Search
CPC ........... H01L 21/6833; H01L 21/67109; H01L 21/6875; H01L 21/68785; H01L 21/6831;
(Continued)

(56) References Cited

U.S. PATENT DOCUMENTS 5,177,878 A * 1/1993 Visser ...................... C23C 14/50
165/80.1
5,374,829 A * 12/1994 Sakamoto ............... C30B 25/12
250/453.11
(Continued)

FOREIGN PATENT DOCUMENTS

JP    H07-106314 A    4/1995
JP    2005-268735 A    9/2005
(Continued)

OTHER PUBLICATIONS

International Search Report and Written Opinion dated Jul. 31, 2015 for PCT Application No. PCT/US2015/027895.
(Continued)

*Primary Examiner* — Tu B Hoang
*Assistant Examiner* — Masahiko Muranami
(74) *Attorney, Agent, or Firm* — Moser Taboada

(57) ABSTRACT

An electrostatic chuck for retaining a substrate is provided herein. In some embodiments, an electrostatic chuck for retaining a substrate may include a susceptor including an electrically conductive susceptor base having one or more cooling channels formed in an upper surface thereof; a raised central support disposed over the one or more cooling channels; and a dielectric top plate disposed on the raised central support, wherein the dielectric top plate has an embossed top surface, and wherein the dielectric top plate and raised central support include a plurality of holes to facilitate delivery of a cooling gas one or more cooling channels to a backside of the substrate when disposed on the embossed top surface of the dielectric top plate.

19 Claims, 5 Drawing Sheets

(51) Int. Cl.
  *H01L 21/687* (2006.01)
  *H05B 6/06* (2006.01)
  *H05B 6/10* (2006.01)

(52) U.S. Cl.
  CPC ......... *H01L 21/68785* (2013.01); *H05B 6/06* (2013.01); *H05B 6/105* (2013.01)

(58) Field of Classification Search
  CPC ......... H01L 21/68714; H01L 21/67103; H01L 23/34; H01L 2221/67; H01L 2221/683; H01L 2224/75251; H01L 2224/755; H01L 2224/75501; H01L 2224/75723; H01L 2224/75724; H01L 2224/76981; H01L 21/673; H01L 21/6735; H01L 21/67353; H01L 21/67383; H01L 21/683; H01L 21/68721; H01L 21/68735; H01L 21/67366; H05B 6/06; H05B 6/105; H01J 37/32; H01J 37/20; H01J 37/32715; H01J 37/32697; H01J 37/32706; H01J 37/32642; H01J 37/32724; C23C 14/00; C23C 4/00; C23C 16/00; C23C 14/50; C23C 16/458; C23C 16/4582; C23C 16/4583; C23C 16/4587; C23C 14/505; C23C 16/4584; C23C 16/4588; C23C 16/4586; C23C 16/4585; C23C 14/51; C23C 14/541; C23C 16/48; C23C 16/50; C23C 16/463; C23C 16/466; C23C 16/4581; F27D 5/00; F27D 9/00; B23Q 3/154; C30B 25/00; F27B 5/00; B65G 49/05; B65G 49/07
  USPC .............. 219/121.43, 121.4, 121.49, 121.51, 219/121.55, 121.58, 618, 638, 643, 647, 219/655, 677, 390, 634, 635; 118/723 E, 118/723 I, 728, 729, 730, 731, 732; 156/345.26, 345.27, 345.48, 915, 345.51, 156/345.52, 345.53, 345.54, 345.55; 438/799; 361/233
  See application file for complete search history.

(56) References Cited

U.S. PATENT DOCUMENTS

| | | | |
|---|---|---|---|
| 5,382,311 A * | 1/1995 | Ishikawa | C23C 16/4586 118/723 E |
| 5,522,131 A | 6/1996 | Steger | |
| 5,529,657 A | 6/1996 | Ishii | |
| 5,680,013 A * | 10/1997 | Dornfest | H01J 37/32495 118/723 E |
| 5,841,624 A | 11/1998 | Xu et al. | |
| 5,903,428 A | 5/1999 | Grimard et al. | |
| 5,986,874 A * | 11/1999 | Ross | H01L 21/6831 279/128 |
| 6,040,011 A * | 3/2000 | Yudovsky | C23C 16/4412 118/728 |
| 6,108,189 A * | 8/2000 | Weldon | C23C 16/4586 279/128 |
| 6,179,924 B1 * | 1/2001 | Zhao | C23C 16/14 118/725 |
| 6,219,219 B1 * | 4/2001 | Hausmann | H01L 21/6831 361/234 |
| 6,394,797 B1 * | 5/2002 | Sugaya | H01L 21/67248 432/253 |
| 6,464,795 B1 * | 10/2002 | Sherstinsky | C23C 16/45521 118/715 |
| 7,869,184 B2 | 1/2011 | Steger | |
| 2002/0150789 A1 | 10/2002 | Hiramatsu et al. | |
| 2003/0029610 A1 * | 2/2003 | Moslehi | C23C 14/50 165/206 |
| 2003/0049580 A1 * | 3/2003 | Goodman | H01L 21/68735 432/258 |
| 2003/0155078 A1 * | 8/2003 | Ogasawara | H01J 37/32009 156/345.47 |
| 2004/0084143 A1 * | 5/2004 | Ivanov | B24B 37/30 156/345.11 |
| 2004/0218340 A1 | 11/2004 | Kitabayashi et al. | |
| 2005/0042881 A1 | 2/2005 | Nishimoto et al. | |
| 2005/0105243 A1 * | 5/2005 | Lee | H01L 21/6833 361/234 |
| 2006/0222481 A1 * | 10/2006 | Foree | C23C 16/45521 414/800 |
| 2007/0144442 A1 | 6/2007 | Migita | |
| 2007/0217119 A1 * | 9/2007 | Johnson | H01L 21/6831 361/234 |
| 2009/0284894 A1 * | 11/2009 | Cooke | H01L 21/6831 361/234 |
| 2011/0151122 A1 * | 6/2011 | Kato | C23C 16/402 427/255.23 |
| 2014/0073066 A1 | 3/2014 | Tabuchi | |

FOREIGN PATENT DOCUMENTS

| | | |
|---|---|---|
| JP | 2007-109771 A | 4/2007 |
| JP | 2013-115352 | 6/2013 |
| JP | 2014-49685 A | 3/2014 |

OTHER PUBLICATIONS

Search Rep[ort for Taiwan Invention Patent Application No. 104113955 dated Aug. 1, 2018.

* cited by examiner

US 10,832,931 B2

ELECTROSTATIC CHUCK WITH EMBOSSED TOP PLATE AND COOLING CHANNELS

CROSS-REFERENCE TO RELATED APPLICATIONS

This application claims benefit of U.S. provisional patent application Ser. No. 62/005,002, filed May 30, 2014, which is herein incorporated by reference in its entirety.

FIELD

Embodiments of the present disclosure generally relate to equipment for performing semiconductor device fabrication, and more particularly, to an electrostatic chuck for supporting a semiconductor substrate during processing.

BACKGROUND

Electrostatic chucks (ESC) are widely used for providing support to substrates (also referred to herein as semiconductor wafers or wafers) within semiconductor processing equipment such as a plasma processing chamber. An electrostatic chuck generally holds a substrate in a stationary position during processing of the substrate, i.e., during material deposition or etching. Electrostatic chucks utilize capacitive and Johnsen-Rahbeck attractive forces for holding the substrate in position.

Electrostatic chucks (ESC) are widely used for providing support to substrates within semiconductor processing equipment such as a plasma processing chamber. An embossed electrostatic chuck has a plurality of protrusions on the clamping surface of the chuck to support the workpiece. These protrusions may also be referred to as "mesas" or "embossments." In general, supporting the workpiece on such protrusions may be beneficial since the contact area with the backside of the workpiece is decreased compared to a non-embossed clamping surface. It is generally accepted that less contact with the backside of the workpiece generally results in less particle generation which is beneficial in some processing applications. In addition, some processing applications may provide a backside cooling gas to cool the backside of the workpiece during processing.

Accordingly, the inventors have provided an improved electrostatic chuck that includes an embossed top plate that enables improved backside gas distribution.

SUMMARY

An electrostatic chuck for retaining a substrate is provided herein. In some embodiments, an electrostatic chuck for retaining a substrate may include a susceptor including an electrically conductive susceptor base having one or more cooling channels formed in an upper surface thereof; a raised central support disposed over the one or more cooling channels; and a dielectric top plate disposed on the raised central support, wherein the dielectric top plate has an embossed top surface, and wherein the dielectric top plate and raised central support include a plurality of holes to facilitate delivery of a cooling gas one or more cooling channels to a backside of the substrate when disposed on the embossed top surface of the dielectric top plate.

In some embodiments, an apparatus for processing a substrate may include chamber defining a process region, an electrostatic chuck for retaining a substrate in the process region, the electrostatic chuck comprising a pedestal; and a susceptor disposed on the pedestal including an electrically conductive susceptor base having one or more cooling channels formed in an upper surface thereof; a raised central support disposed over the one or more cooling channels; and a dielectric top plate disposed on the raised central support, wherein the dielectric top plate has an embossed top surface, and wherein the dielectric top plate and raised central support include a plurality of holes to facilitate delivery of a cooling gas one or more cooling channels to a backside of the substrate when disposed on the embossed top surface of the dielectric top plate.

In some embodiments, An electrostatic chuck for retaining a 150 mm substrate may include a susceptor including an aluminum susceptor base having one or more cooling channels formed in an upper surface thereof an aluminum raised central support disposed over the one or more cooling channels; and a 150 mm ceramic top plate disposed on the raised central support, wherein the ceramic top plate has an embossed top surface, and wherein the ceramic top plate and raised central support include a plurality of holes to facilitate delivery of a cooling gas provided by the one or more cooling channels to a backside of the substrate when disposed on the embossed top surface of the ceramic top plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are thus not to be considered limiting of its scope, for the disclosure may admit to other equally effective embodiments.

Figure 1:
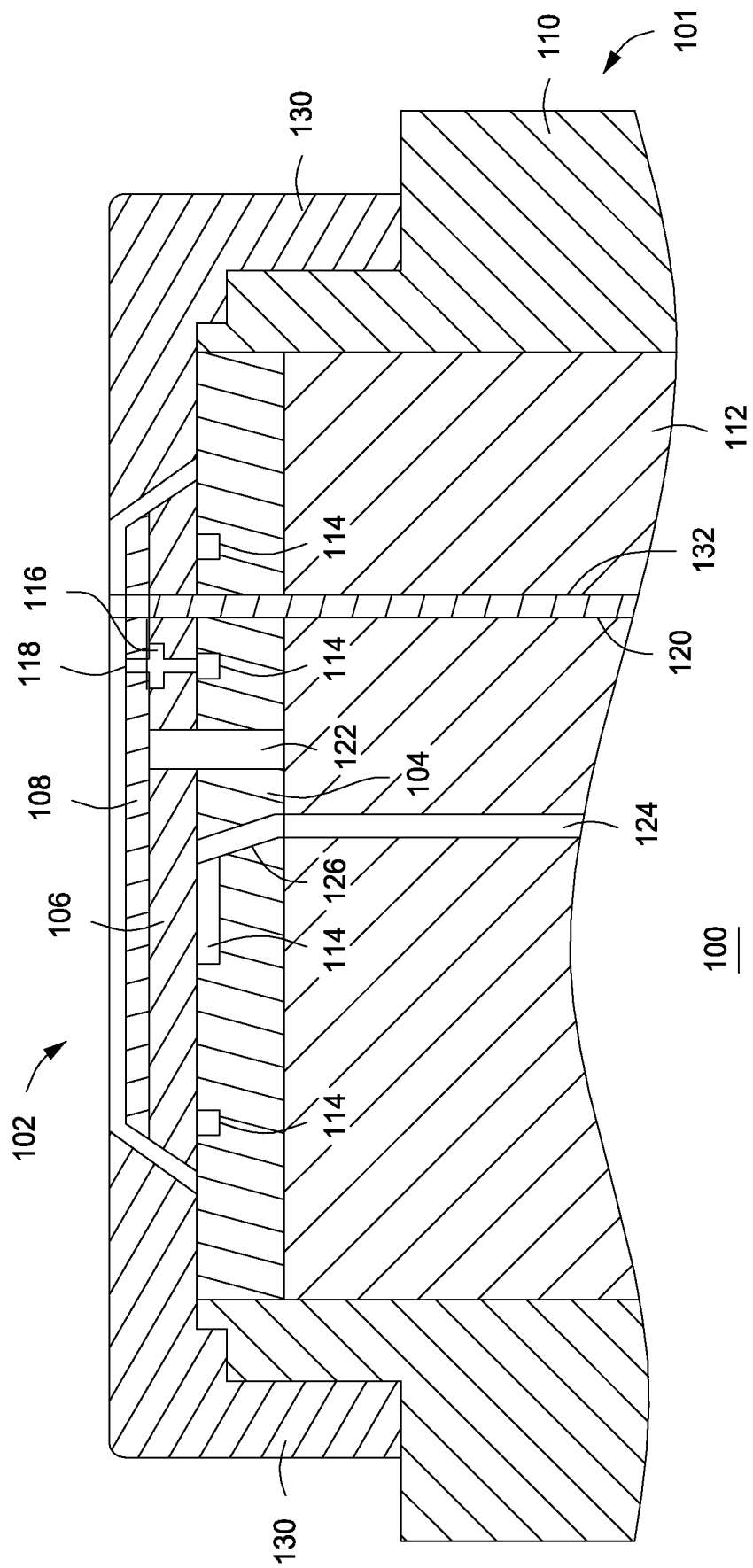
FIG. 1 depicts a side cross-section view of an electrostatic chuck in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Electrostatic chucks (ESC) having improved embossing and cooling channels provided herein. In some embodiments, and as discussed in further detail below, the improved ESC may include an embossed ceramic top plate having a straight or tapered edge, that may be used with existing ESC designs, for example, with a 150 mm ESC design.

FIG. 1 depicts a cross-sectional view of an electrostatic chuck 100 in accordance with some embodiments of the present disclosure. The electrostatic chuck 100 is used during plasma processing of a semiconductor substrate, e.g., etching, physical vapor deposition (PVD) and plasma cleaning. The electrostatic chuck 100 comprises a pedestal 101 and a susceptor 102. In some embodiments, the pedestal 101 includes a cathode structure 110 and a cooling plate 112. In some embodiments, the susceptor 102 may include a susceptor base 104, a raised central support 106 disposed on susceptor base 104, and a dielectric top plate 108 disposed on the raised central support 106. A capture ring 130 circumscribes and secures the susceptor 102 to the pedestal 101.

The cathode structure 110 has a basin shape and serves as the basic structural support for the electrostatic chuck 100. The cathode structure 110 is typically made from a robust metal such as stainless steel. The disk shaped cooling plate 112, disposed within cathode structure 110, supports the susceptor 102 and facilitates the delivery of cooling fluids/gases to the susceptor 102. Cooling plate 112 includes one or more lift pin holes 132 to accommodate one or more lift pins 120 that are used to position a substrate when disposed on the electrostatic chuck 100. The cooling plate 112 also includes one or more conduits 124 for delivering cooling fluid/gases to the susceptor 102.

Figure 2:
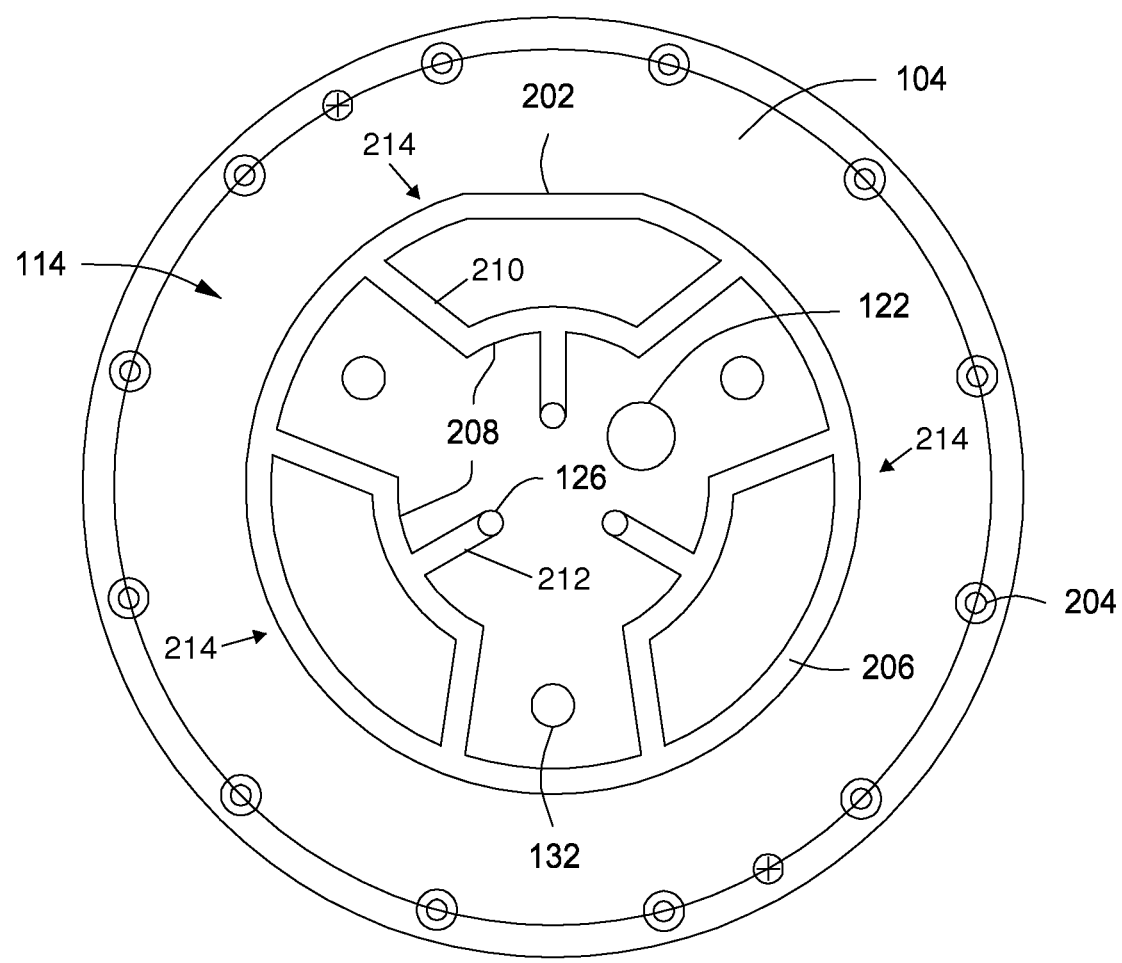
FIG. 2 depicts a top view of a susceptor base of FIG. 1 in accordance with some embodiments of the present disclosure.

The susceptor base 104 includes one or more conduits that align with the one or more conduits 124 to facilitate the delivery of gas to cooling channels 114 formed on a top surface of the susceptor base 104. FIG. 2 illustrates a top plan view of the susceptor base 104 having the cooling channels 114 according to at least one embodiment of the present disclosure. In some embodiments, a backside cooling gas/fluid may be delivered to the top of susceptor base 104 via conduits 126 and flow through cooling channels 114. The susceptor base 104 may be secured to the cooling plate 112 by a number of bolts 204. As shown in FIG. 2, in some embodiments, the cooling channel 114 and have a substantially circular outer channel 206 and a flat portion 202 to accommodate existing electrostatic chuck designs. The cooling channels 114 may also include a plurality of inner channels 208 coupled to the outer channel 206 via a plurality of connecting channels 210 to evenly distribute the cooling gas/fluid. The conduits 126 may be coupled to the inner channels 208 via a plurality of radial channels 212. In some embodiments, the cooling channels 114 may comprise three sets of gas distribution channels 214 axisymmetrically disposed about a central axis of the susceptor base 104, wherein each set of distribution channels is coupled to a common outer channel 206 as shown in FIG. 2. Specifically, each of the three sets of distribution channels may include inlet conduit 126, a radial channel 212 that couples the inlet conduit 126 to an inner channel 208, and two connecting channels 210 that couple each end of the inner channel 208 to the outer channel 206.

Generally, the cooling channels 114 have a rectangular cross-sectional shape. However, in alternate embodiments the cooling channels 114 may have various geometrical cross-sectional shapes. The raised central support 106 is disposed/positioned over the cooling channels 114 to provide a cap over the cooling channels 114. The cooling channels 114 and the bottom surface of the raised central support 106 may be anodized.

Referring back to FIG. 1, the cooling channels 114 may provide cooling gas/fluid to holes 116 disposed in the raised central support 106, and ultimately to a top surface of the dielectric top plate 108 via holes 118 to cool a backside of a substrate disposed on dielectric top plate 108. In some embodiments, a helium gas may be used to flow through cooling channels 114. The gas exits through one or more of the multiple holes 116, 118 (or other forms of passages) and supplies a heat transfer medium to the back surface of a substrate.

The susceptor base 104 may further include cavity to accommodate electrode 122 to provide electrostatic chucking forces to retain a substrate when disposed on dielectric top plate 108.

In some embodiments, the susceptor base 104 may be made from aluminum, copper, or other material. Similarly, the raised central support 106 may also be made from aluminum, copper or other material.

Figure 3A:
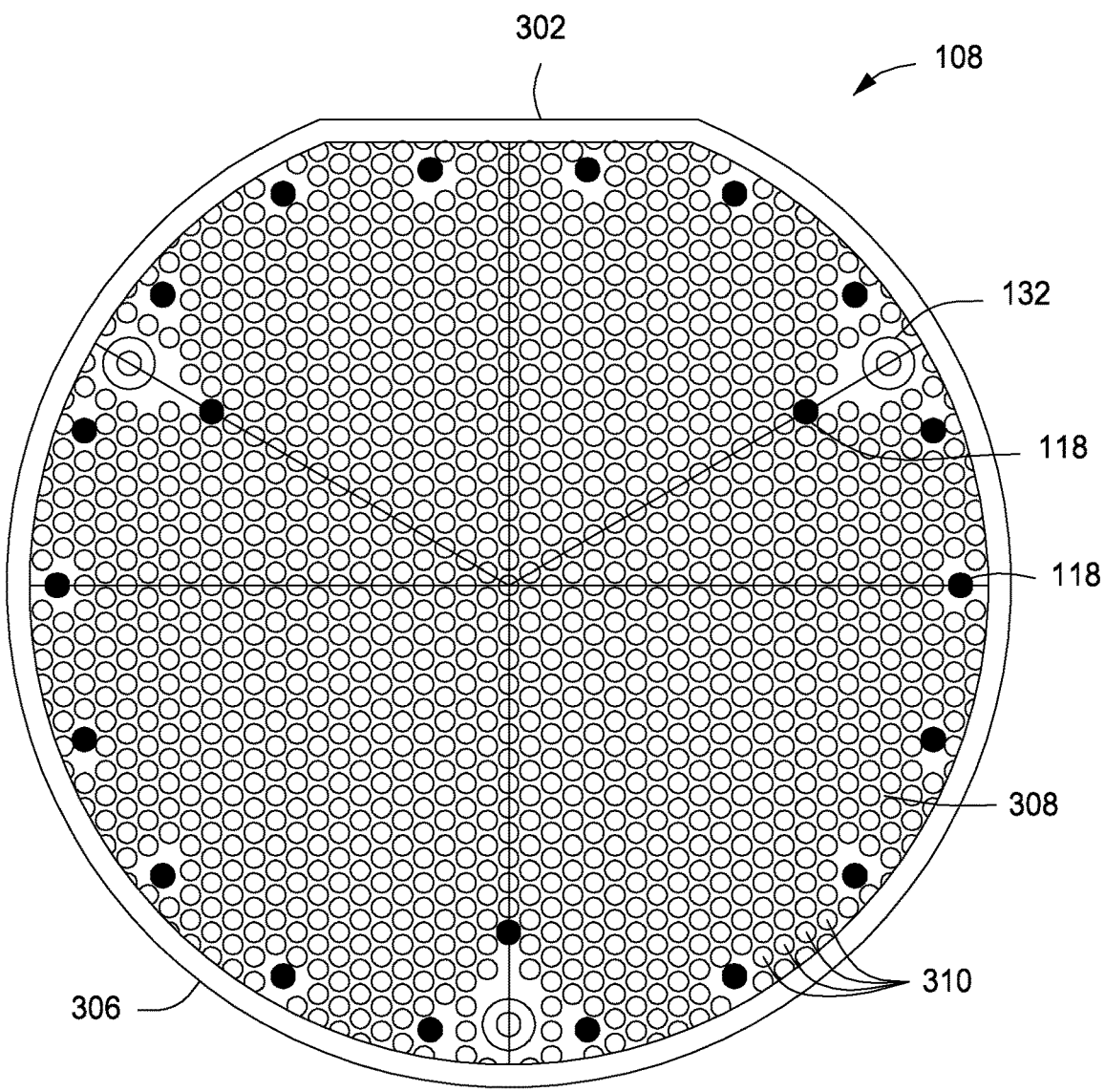
FIGS. 3A and 3B depict a top and side view, respectively, of a dielectric top plate of FIG. 1 in accordance with some embodiments of the present disclosure.
Figure 3B:
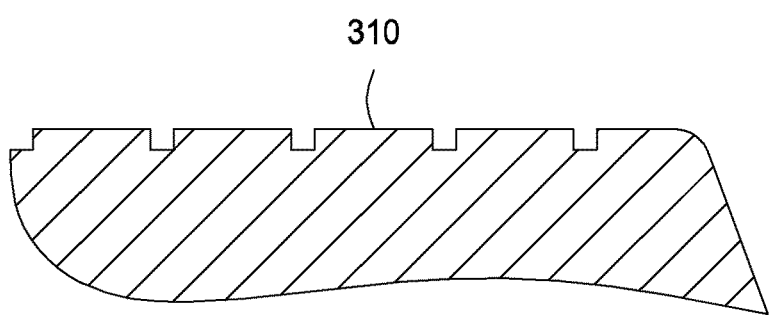

FIGS. 3A and 3B depict at least one embodiment of the dielectric top plate 108 in accordance with the present disclosure. As shown in FIGS. 3A and 3B, a dielectric top plate 108 includes a plurality of holes 118 to provide a backside cooling gas/fluid to the backside of the substrate one disposed thereon. In some embodiments, the number of holes 118 may be between 12 and 36 holes. In some embodiments, a number of holes along an outer diameter of the dielectric top plate 108 may be 18 holes. The number of holes 118 disposed radially inward of the lift pin holes 132 may be 3 holes.

The dielectric top plate 108 may also include a substantially circular outer diameter 306 and a flat portion 302 to accommodate existing electrostatic chuck designs. In some embodiments, the dielectric top plate 108 includes an embossed top surface 308. The embossing reduces the surface area of the support surface that contacts the substrate. The embossing may be formed by an embossing process to produce the raised projections 310. The height of the raised projections 310 may be about 5 to 25 μm. In some embodiments, the raised projections 310 may form an embossing contact area that is about 55% to about 70% of the contact area of a non-embossed surface. In general, supporting a substrate on such an embossed surface is be beneficial since the contact area with the backside of the substrate is decreased compared to a non-embossed clamping surface. The lower contact area with the backside of the substrate generally results in less particle generation which is advantageous in some processing applications. In some embodiments, the dielectric top plate 108 is made from a ceramic material such as aluminum nitride, boron nitride and the like.

In some embodiments, the diameter of the dielectric top plate 108 may be about 150 mm to accommodate a 150 mm substrate, and to be used with 150 mm electrostatic chuck designs. In some embodiments, the dielectric top plate 108 may be about 1 to 5 mm larger or smaller than the substrate that is disposed on the dielectric top plate 108 to be processed.

Figure 4A:
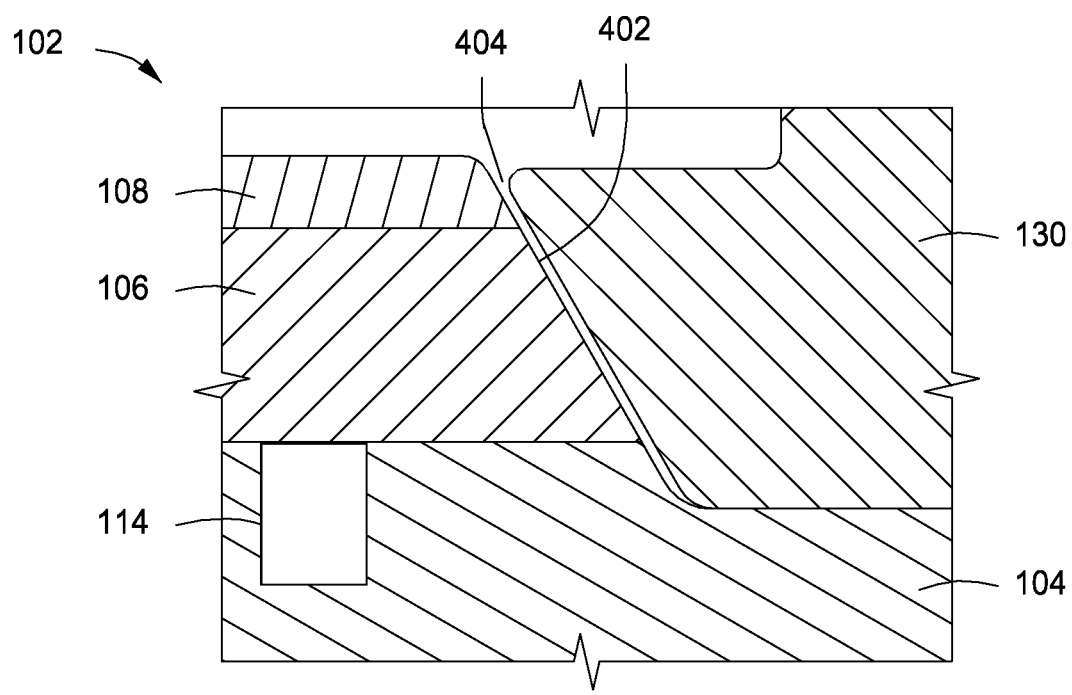
FIGS. 4A and 4B depict a tapered and straight edge susceptor, respectively, in accordance with some embodiments of the present disclosure.
Figure 4B:
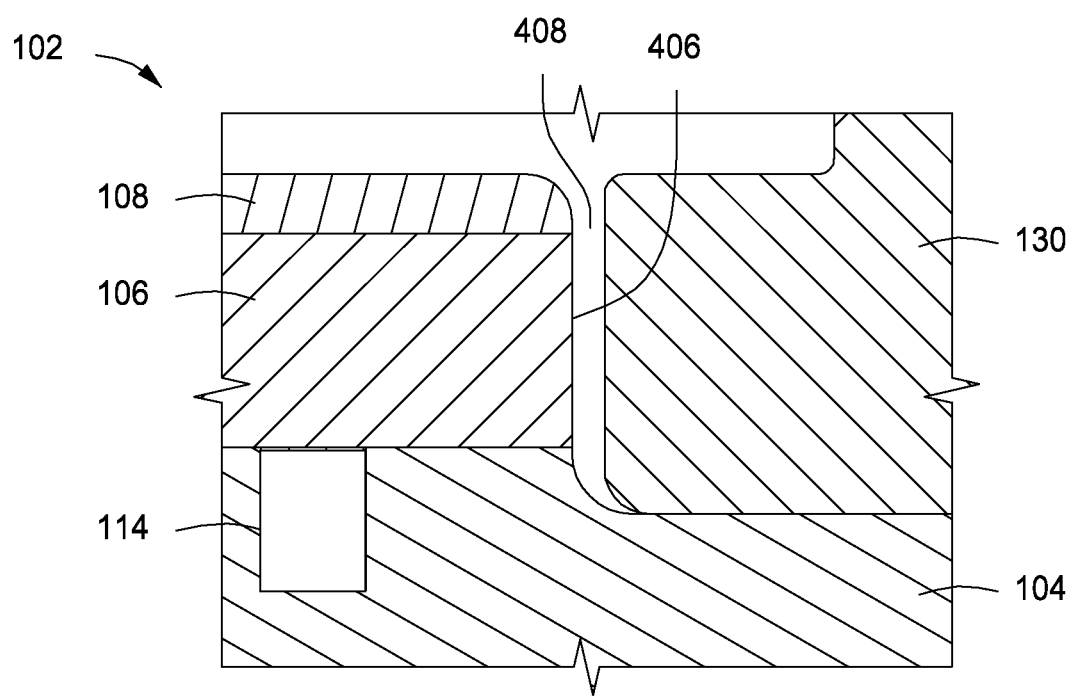

FIGS. 4A and 4B depict a tapered and straight edge, respectively, of the susceptor 102. In FIG. 4A, a tapered edge 402 is shown along with a capture ring 130 also having a tapered edge to produce a uniform gap 404. In some embodiments, the gap may be about 0.1 mm to about 1.0 mm. In FIG. 4B, a straight edge 406 is shown along with a capture ring 130 also having a tapered edge to produce a uniform gap 408. In some embodiments, the gap may be about 0.4 mm to about 1.0 mm.

In some embodiments, the inventive electrostatic chuck may include the helium cooling channels 114 as shown in FIG. 2 and a 150 mm ceramic embossed top plate 108 for used with existing 150 mm electrostatic check designs.

The inventive ESC may be utilized in conjunction with any type of process chamber. Exemplary process chambers include any process chamber used for etching processes, for example, such as the DPS® line of etch reactors, or other process chambers, available from Applied Materials, Inc. of Santa Clara, Calif. Other process chambers, including those from other manufacturers, may similarly be used.

Figure 5:
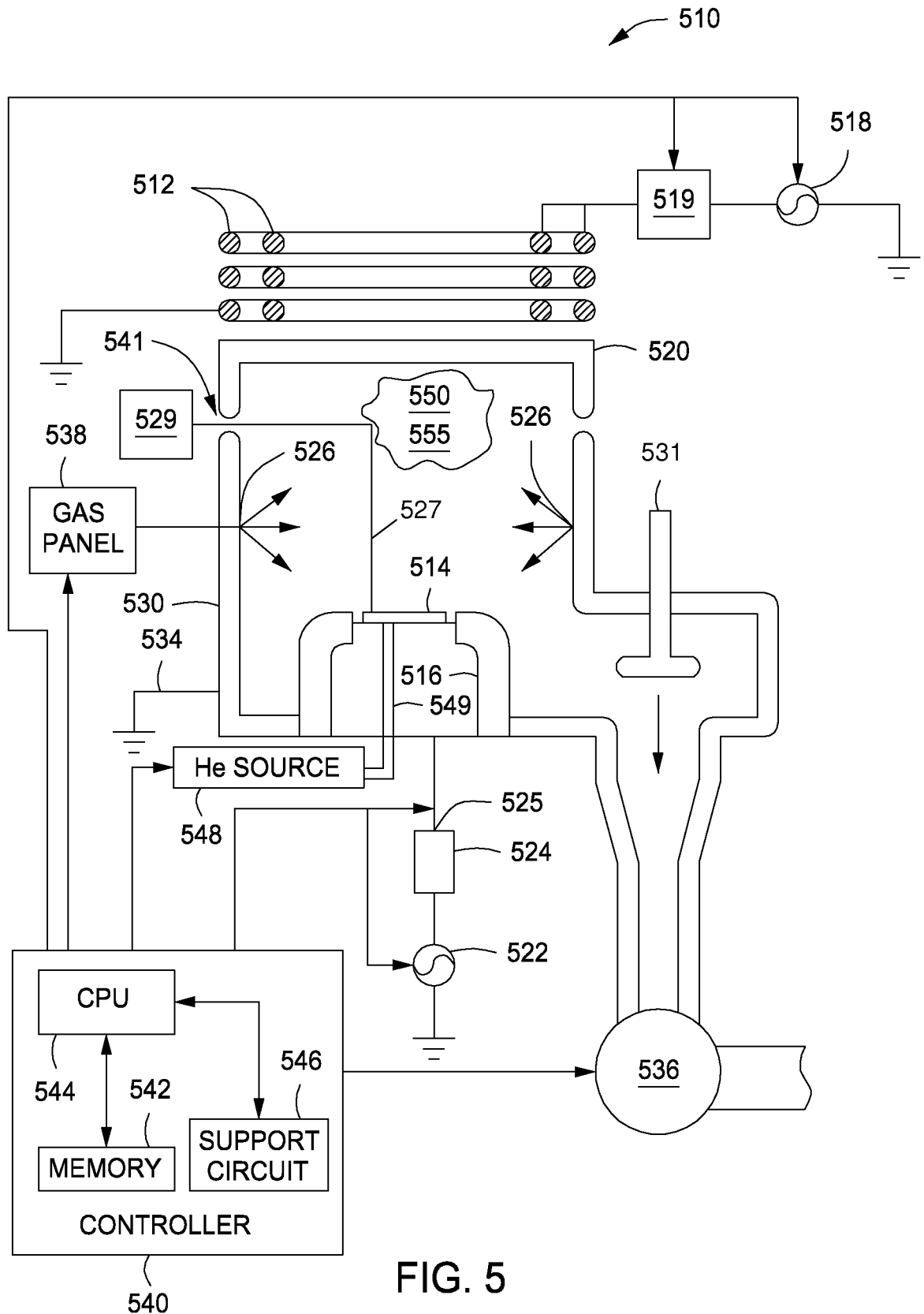
FIG. 5 depicts a plan view of a plasma-based substrate processing system comprising an electrostatic chuck in accordance with some embodiments of the present disclosure.

For example, FIG. 5 depicts a schematic diagram of an illustrative system 500 of the kind that may be used to practice embodiments of the disclosure as discussed herein. The process chamber 510 of system 500 may be utilized alone or as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other process chambers and/or cluster tools may suitably be used as well.

The system 500 generally comprises a process chamber 510 having a substrate support (cathode) 516 within a conductive body (wall) 530, and a controller 540. The chamber 510 may be supplied with a substantially flat dielectric ceiling 520. Alternatively, the chamber 510 may have other types of ceilings, e.g., a dome-shaped ceiling. An antenna comprising at least one inductive coil element 512 is disposed above the ceiling 520 (two co-axial inductive coil elements 512 are shown).

The inductive coil element 512 is coupled to a RF plasma power source 518 through a first matching network 519. The matching network 519 is held during frequency tuning. In some embodiments, the matching network 519 may be used due to the different fixed positions that are used for different processes. In some embodiments, the RF power source 518 may be capable of producing up to 3000 W at a tunable frequency in a range from about +/−5% to about +/−10% of the frequency generator output. For example, a 13.56 MHz RF power source may produce a tunable frequency in a range from about +/−5% to about +/−10% of 13.56 MHz. In some embodiments, the RF power source 518 may be controlled by controller 540.

The substrate support 516 may include an electrostatic chuck for retaining the substrate 514 and is coupled, through a second matching network 524 having a matching network output (cathode input) 525, to a biasing power source 522. In some embodiments, the biasing power source 522 may be capable of producing up to 1500 W at a frequency of approximately 400 kHz. The biasing power may be either continuous or pulsed power. In some embodiments, the biasing power source 522 may be a DC or pulsed DC source. In some embodiments, a probe 527 may be disposed within the chamber 510 proximate the substrate support 516 to provide measurements (e.g., the first DC voltage measurement of the substrate described above) within the process chamber 510. The probe 527 may be fed out of the chamber 510 via a port 541 disposed in the wall 530 of the chamber 510. In some embodiments, a controller 529 may be coupled to the probe 527 to facilitate recording or displaying the measurements of the probe 527.

The controller 540 generally comprises a central processing unit (CPU) 544, a memory 542, and support circuits 546 for the CPU 544 and facilitates control of the components of the chamber 510 and, as such, of the tuning process, as discussed above.

To facilitate control of the process chamber 510 as described above, the controller 540 may be one of any form of general-purpose computer processor that can be used in an industrial setting for controlling various chambers and sub-processors. The memory 542, or computer-readable medium, of the CPU 544 may be one or more of readily available memory such as random access memory (RAM), read only memory (ROM), floppy disk, hard disk, or any other form of digital storage, local or remote. The support circuits 546 are coupled to the CPU 544 for supporting the processor in a conventional manner. These circuits include cache, power supplies, clock circuits, input/output circuitry and subsystems, and the like. The inventive methods described herein are generally stored in the memory 542 as a software routine. The software routine may also be stored and/or executed by a second CPU (not shown) that is remotely located from the hardware being controlled by the CPU 544.

In an exemplary operation of the process chamber 510, a substrate 514 is placed on the substrate support 516 and process gases are supplied from a gas panel 538 through entry ports 526 and form a gaseous mixture 550. The gaseous mixture 550 is ignited into a plasma 555 in the chamber 510 by applying power from the plasma power source 518 and biasing power source 522 to the inductive coil element 512 and the substrate support 516 (i.e., cathode structure), respectively. The pressure within the interior of the chamber 510 is controlled using a throttle valve 531 and a vacuum pump 536. Typically, the wall 530 is coupled to an electrical ground 534. The temperature of the wall 530 may be controlled using liquid-containing conduits (not shown) that run through the wall 530.

In some embodiments, the temperature of the substrate 514 may be controlled by stabilizing a temperature of the substrate support 516. In some embodiments, a gas from a gas source 548 is provided via a gas conduit 549 to channels (not shown) formed in the pedestal surface under the substrate 514. The gas is used to facilitate heat transfer between the substrate support 516 and the substrate 514. During processing, the substrate support 516 may be heated by a resistive heater (not shown) within the substrate support 516 to a steady state temperature and then the helium gas facilitates uniform heating of the substrate 514.

While the foregoing is directed to embodiments of the present disclosure, other and further embodiments of the disclosure may be devised without departing from the basic scope thereof.

The invention claimed is:

1. An electrostatic chuck for retaining a substrate, comprising:
   a susceptor including:
      an electrically conductive susceptor base having one or more cooling channels formed on an upper surface thereof, wherein the one or more cooling channels include a circular outer channel and a plurality of inner channels coupled to the outer channel via a plurality of connecting channels;
   a raised central support made of a metal disposed on the electrically conductive susceptor base and over the one or more cooling channels; and
   a dielectric top plate made of a ceramic disposed on the raised central support, wherein the dielectric top plate has an embossed top surface, wherein the dielectric top plate and raised central support include a plurality of holes to facilitate delivery of a cooling gas provided by the one or more cooling channels to a backside of the substrate when disposed on the embossed top surface of the dielectric top plate, wherein the embossed top surface forms raised projections, and wherein the raised central support caps the cooling channels formed on the upper surface of the electrically conductive susceptor base to prevent a cooling gas from escaping the cooling channels except through the plurality of holes.

2. The electrostatic chuck of claim 1, wherein the susceptor base and the raised central support comprise aluminum.

3. The electrostatic chuck of claim 1, wherein the dielectric top plate is made from aluminum nitride, aluminum oxide or boron nitride.

4. The electrostatic chuck of claim 1, wherein the dielectric top plate is sized to support a 150 mm substrate.

5. The electrostatic chuck of claim 1, further comprising:
one or more lift pin holes disposed through the susceptor base, the raised central support, and the dielectric top plate.

6. The electrostatic chuck of claim 1, the dielectric top plate further comprising:
a plurality of embossed features extending from an upper surface of the dielectric top plate, wherein the plurality of embossed features form an embossing contact area that is 55% to 70% of the contact area of a non-embossed surface.

7. The electrostatic chuck of claim 1, wherein the susceptor includes a tapered edge.

8. The electrostatic chuck of claim 1, wherein the circular outer channel is an annular channel that includes a straight channel portion.

9. An apparatus for processing a substrate, comprising:
a chamber defining a process region;
an electrostatic chuck for retaining a substrate in the process region, the electrostatic chuck comprising:
a pedestal; and
a susceptor disposed on the pedestal including:
an electrically conductive susceptor base having one or more cooling channels formed on an upper surface thereof;
a raised central support made of a metal disposed on the electrically conductive susceptor base and disposed over the one or more cooling channels to provide a cap to cover the cooling channels formed on an upper surface of the electrically conductive susceptor base; and
a dielectric top plate made of a ceramic disposed on the raised central support, wherein the dielectric top plate has an embossed top surface which forms raised projections, and wherein the dielectric top plate and raised central support include a plurality of holes to facilitate delivery of a cooling gas provided by the one or more cooling channels to a backside of the substrate when disposed on the embossed top surface of the dielectric top plate.

10. The apparatus of claim 9, wherein the electrostatic chuck further comprises a single capture ring for securing the susceptor to the pedestal.

11. The apparatus of claim 9, wherein the pedestal comprises:
a base cathode structure; and
a cooling plate supported by the base cathode structure, wherein the susceptor is disposed on the cooling plate.

12. The apparatus of claim 9, wherein the dielectric top plate is a ceramic top plate.

13. The apparatus of claim 9, wherein the dielectric top plate is sized to support a 150 mm substrate.

14. An electrostatic chuck for retaining a 150 mm substrate, comprising:
a susceptor including:
an aluminum susceptor base having one or more cooling channels formed on an upper surface thereof;
an aluminum raised central support disposed over the one or more cooling channels to provide a cap to cover the cooling channels formed in an upper surface of the aluminum susceptor base; and
a 150 mm ceramic top plate disposed on the raised central support, wherein the ceramic top plate has an embossed top surface which forms raised projections, and wherein the ceramic top plate and raised central support include a plurality of holes to facilitate delivery of a cooling gas provided by the one or more cooling channels to a backside of the substrate when disposed on the embossed top surface of the ceramic top plate, and wherein the raised central support caps the cooling channels formed on the upper surface of the aluminum susceptor base to prevent a cooling gas from escaping the cooling channels except through the plurality of holes.

15. The electrostatic chuck of claim 14, wherein the one or more cooling channels include three sets of gas distribution channels axisymmetrically disposed about a central axis of the aluminum susceptor base.

16. The electrostatic chuck of claim 15, wherein each set of distribution channels is coupled to a common outer channel, and wherein each of the three sets of distribution channels includes an inlet conduit to provide cooling gas fluid, a radial channel that couples the inlet conduit to an inner channel, and two connecting channels that couple each end of the inner channel to the common outer channel.

17. The electrostatic chuck of claim 14, wherein the aluminum raised central support and the ceramic top plate include a circular outer diameter and a flat portion.

18. The electrostatic chuck of claim 14, wherein the aluminum raised central support and the ceramic top plate include a tapered edge.

19. The electrostatic chuck of claim 14, wherein the aluminum raised central support and the ceramic top plate include a straight edge.

* * * * *